United States Patent
Najjari et al.

(10) Patent No.: US 11,251,752 B2
(45) Date of Patent: Feb. 15, 2022

(54) TEMPERATURE CORRECTION CIRCUIT AND METHOD OF OPERATING A POWER AMPLIFIER

(71) Applicant: NXP B.V., San Jose, CA (US)

(72) Inventors: Hamza Najjari, Caen (FR); Christophe Cordier, Caen (FR); Jean-Baptiste Begueret, Villenave d'Ornon (FR)

(73) Assignee: NXP B.V., Eindhoven (NL)

(*) Notice: Subject to any disclaimer, the term of this patent is extended or adjusted under 35 U.S.C. 154(b) by 108 days.

(21) Appl. No.: 16/860,645

(22) Filed: Apr. 28, 2020

(65) Prior Publication Data
US 2020/0366246 A1    Nov. 19, 2020

(30) Foreign Application Priority Data

May 14, 2019   (EP) ..................................... 19305614

(51) Int. Cl.
*H03F 1/30*     (2006.01)
*H03F 1/02*     (2006.01)
(Continued)

(52) U.S. Cl.
CPC ............. *H03F 1/0205* (2013.01); *H03F 1/30* (2013.01); *H03F 3/19* (2013.01); *H03F 3/211* (2013.01);
(Continued)

(58) Field of Classification Search
CPC ....................................................... H03F 1/30
(Continued)

(56) References Cited

U.S. PATENT DOCUMENTS

| 5,396,163 A * | 3/1995 | Nor ................... H02J 7/007182 |
| | | 320/159 |
| 10,230,335 B2 | 3/2019 | Rabjohn et al. |
| (Continued) | | |

OTHER PUBLICATIONS

Agawa, K., "A 0.13 μm CMOS Bluetooth EDR Transceiver with High Sensitivity over Wide Temperature Range and Immunity to Process Variation", IEICE Trans. Electron., vol. E93-C, No. 6, Jun. 2010.

(Continued)

*Primary Examiner* — Henry Choe

(57) ABSTRACT

A temperature correction circuit and method for maintaining a transistor of a power amplifier in a linear operating region of the transistor. The temperature correction circuit includes a first current source circuit operable to provide a first correction current proportional to an absolute temperature of a semiconductor die including the transistor. The temperature correction circuit also includes a second current source circuit operable to provide a second correction current proportional to a change in temperature of a part of the semiconductor die in which the transistor is located during operation of the transistor. The temperature correction circuit further includes a third current source circuit operable to provide a gain selection current. The temperature correction circuit also includes circuitry for producing a reference current from the first and second correction currents and the gain current. The temperature correction circuit further includes an output for providing the reference current to the transistor.

20 Claims, 4 Drawing Sheets

(51) Int. Cl.
*H03F 3/19* (2006.01)
*H03F 3/21* (2006.01)

(52) U.S. Cl.
CPC .. *H03F 2200/447* (2013.01); *H03F 2200/451* (2013.01); *H03G 2201/708* (2013.01)

(58) Field of Classification Search
USPC ........................................ 330/289, 296, 285
See application file for complete search history.

(56) References Cited

U.S. PATENT DOCUMENTS

| | | | |
|---|---|---|---|
| 2007/0030067 A1* | 2/2007 | Brueske | G06G 7/24 330/254 |
| 2018/0062585 A1 | 3/2018 | Quaglietta et al. | |
| 2021/0273610 A1* | 9/2021 | Telsto | H03B 5/364 |

OTHER PUBLICATIONS

Degani, O., "A 90nm CMOS PA Module for 4G applications with embedded PVT gain compensation circuit", IEEE Topical Conference on Power Amplifiers for Wireless and Radio Applications (PAWR), Jan. 15-18, 2012.

Huang, C., "A Multimode 5-6 GHz SiGe BiCMOS PA Design Powers Emerging Wireless LAN Radio Standards", IEEE Bipolar/BICMOS Circuits and Technology Meeting (BCTM), Oct. 2017.

Lee, H., "A Wideband CMOS Variable Gain Amplifier With an Exponential Gain Control", IEEE Transactions on Microwave Theory and Techniques, vol. 55, No. 6, Jun. 2007.

* cited by examiner

TEMPERATURE CORRECTION CIRCUIT AND METHOD OF OPERATING A POWER AMPLIFIER

CROSS-REFERENCE TO RELATED APPLICATIONS

This application claims the priority under 35 U.S.C. § 119 of European Patent application no. 19305614.0, filed on 14 May 2019, the contents of which are incorporated by reference herein.

The present specification relates to a temperature correction circuit for maintaining a transistor of a power amplifier in a linear operating region. The present specification also relates to a method of operating a power amplifier.

BACKGROUND

Traditionally, static Error Vector Magnitude (EVM) calculations for power amplifiers have been based on amplitude-to-amplitude modulation (AM/AM) and amplitude-to-phase modulation (AM/PM) distortions and are proportional mainly to $P_{out}/(I_{cq}^2 \cdot R_1)$, where $P_{out}$ is the output power of the power amplifier, $I_{cq}$ is the quiescent current of the power amplifier and $R_1$ is the load impendence.

However, this type of calculation does not capture the dynamic thermal behaviour of the power amplifier, which may be important to consider, especially in Time Division Duplex (TDD) systems and flip chip packages.

The Dynamic Error Vector Magnitude (DEVM) is directly dependent on power gain variation. In wide temperature range bipolar power amplifiers, the power gain stabilization becomes important when targeting low DEVM levels.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a temperature correction circuit for maintaining a transistor of a power amplifier in a linear operating region of said transistor, the temperature correction circuit comprising:

a first current source circuit operable to provide a first correction current proportional to an absolute, static temperature of a semiconductor die including said transistor;

a second current source circuit operable to provide a second correction current proportional to a change in temperature of a part of said semiconductor die in which the transistor is located during operation of the transistor;

a third current source circuit operable to provide a gain selection current;

circuitry for producing a reference current from said first and second correction currents and said gain current; and an output for providing said reference current to said transistor.

According to another aspect of the present disclosure, there is provided a method of operating a power amplifier, the method comprising:

providing a gain selection current;

providing a first correction current proportional to an absolute temperature of a semiconductor die including a transistor of said power amplifier:

providing a second correction current proportional to a change in temperature of a part of said semiconductor die in which the transistor is located during operation of the transistor;

producing a reference current from said first and second correction currents and said gain current; and providing said reference current to said transistor for maintaining said transistor in a linear operating region.

A temperature correction circuit and method according to embodiments of this disclosure can allow the operation of a power amplifier to be corrected for static and dynamic temperature variations. This may be achieved using a single reference current.

The circuitry for producing a reference current may include a static temperature sub-circuit configured to use the first correction current and the gain selection current to produce a contribution to the reference current associated with the absolute, static temperature of the die.

The circuitry for producing a reference current may include a dynamic temperature sub-circuit configured to use the first correction current and the second current to produce a contribution to the reference current associated with the change in temperature of the part of the semiconductor die in which the transistor is located.

The separate provision of a static temperature sub-circuit and a dynamic temperature sub-circuit may allow the static and dynamic contributions to the reference current to be produced separately, in a manner in which the dynamic correction does not affect the static correction, and vice versa.

The dynamic temperature sub-circuit may include:

circuitry for producing the contribution to the reference current associated with the change in temperature of the part of the semiconductor die in which the transistor is located from the second correction current; and circuitry for removing a static part from the contribution using the first correction current.

The static temperature sub-circuit may include one or more programmable current mirrors for producing the contribution to the reference current associated with the absolute, static temperature of the die.

The dynamic temperature sub-circuit may include one or more programmable current mirrors for producing the contribution to the reference current associated with the change in temperature of the part of the semiconductor die in which the transistor is located.

The temperature correction circuit may be configured to use one or more code words for controlling the current mirrors to produce the contributions to the reference current. These control codes may be provided by digital circuitry of the temperature correction circuit.

The reference current may be suitable for biasing the transistor of the power amplifier.

The temperature correction circuit may be configured to determine the gain selection current according to a gain mode of the power amplifier.

The first current source circuit may include a current mirror, a current source operable to output a current based on a bandgap voltage reference, and a pair of cross coupled transistors located at a temperature of the die.

The first current source circuit may include:

a first transistor pair comprising:

a first transistor having a first current terminal, a second current terminal and a control terminal; and a second transistor having a first current terminal, a second current terminal and a control terminal; and a second transistor pair comprising:
a first transistor having a first current terminal, a second current terminal and a control terminal; and
a second transistor having a first current terminal, a second current terminal and a control terminal; and
wherein:
the pair of cross coupled transistors of the first current source circuit comprises the second transistor pair;
the control terminal of the first transistor of the first transistor pair is coupled to the control terminal of the second transistor of the first transistor pair,
the current source is coupled to the first control terminal of the first transistor of the first transistor pair and to the control terminals of the first transistor and the second transistor of the first transistor pair,
the second current terminal of the first transistor of the first transistor pair is coupled to the first current terminal of the first transistor of the second transistor pair,
the second current terminal of the second transistor of the first transistor pair is coupled to the first current terminal of the second transistor of the second transistor pair,
the control terminal of the first transistor of the second transistor pair is coupled to the first current terminal of the second transistor of the second transistor pair,
the control terminal of the second transistor of the second transistor pair is coupled to the first current terminal of the first transistor of the second transistor pair,
the second current terminal of the first transistor of the second transistor pair is coupled to ground, and
the second current terminal of the second transistor of the second transistor pair is coupled to ground via a resistor.

The second current source circuit may include a current mirror, a current source operable to output a current based on a bandgap voltage reference, and a pair of cross coupled transistors located at a temperature of a junction of the transistor of the power amplifier.

The first current source circuit may include:
a first transistor pair comprising:
a first transistor having a first current terminal, a second current terminal and a control terminal, and
a second transistor having a first current terminal, a second current terminal and a control terminal; and
a second transistor pair comprising:
a first transistor having a first current terminal, a second current terminal and a control terminal; and
a second transistor having a first current terminal, a second current terminal and a control terminal; and
wherein:
the pair of cross coupled transistors of the second current source circuit comprises the second transistor pair;
the control terminal of the first transistor of the first transistor pair is coupled to the control terminal of the second transistor of the first transistor pair,
the current source is coupled to the first current terminal of the first transistor of the first transistor pair and to the control terminals of the first transistor and the second transistor of the first transistor pair,
the second current terminal of the first transistor of the first transistor pair is coupled to the first current terminal of the first transistor of the second transistor pair,
the second current terminal of the second transistor of the first transistor pair is coupled to the first current terminal of the second transistor of the second transistor pair,
the control terminal of the first transistor of the second transistor pair is coupled to the first current terminal of the second transistor of the second transistor pair, the control terminal of the second transistor of the second transistor pair is coupled to the first current terminal of the first transistor of the second transistor pair,
the second current terminal of the first transistor of the second transistor pair is coupled to ground, and
the second current terminal of the second transistor of the second transistor pair is coupled to ground via a resistor.

The power amplifier may be a Radio Frequency (RF) power amplifier.

The power amplifier may be coupled to the output of the temperature correction circuit for providing the reference current to the transistor of the power amplifier.

For the purposes of this disclosure "Radio Frequency" (RF) refers to frequencies typically in the range of, but not limited to $0.5\ GHz \leq f \leq 100\ GHz$.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Figure 1:
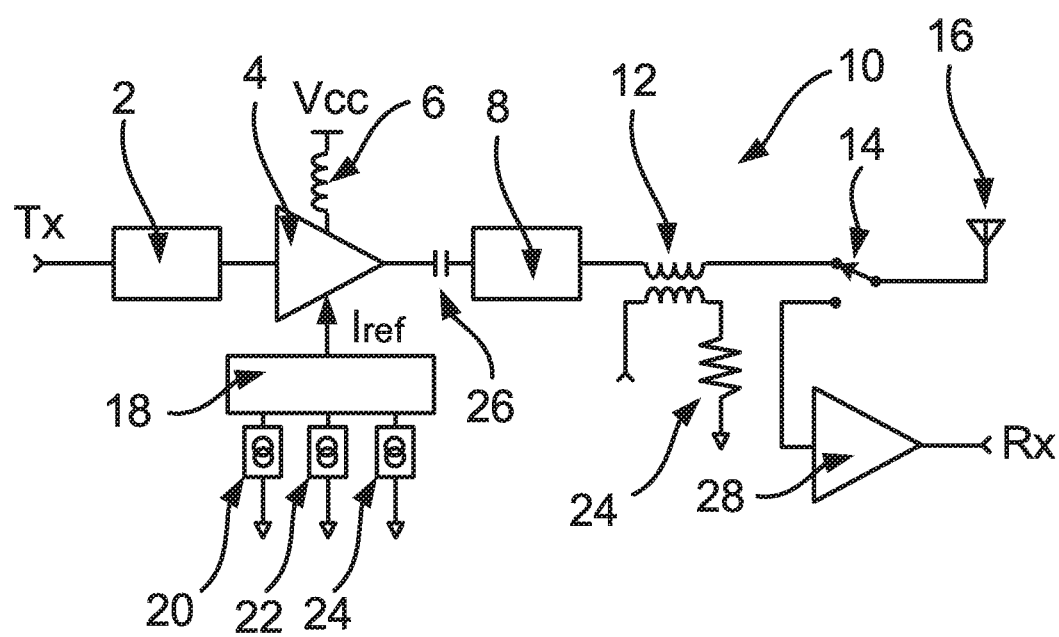
FIG. 1 shows a block diagram of an RF Front End, according to an embodiment of this disclosure.

FIG. 1 shows a block diagram of a radio frequency front end 10 (hereinafter "front end" or "RFFE"), according to an embodiment of this disclosure.

The RFFE 10 includes an antenna 16, which may be used to transmit and receive radio frequency signals. A switch 14 may be provided to route the transmitted and received signals within the RFFE 10. As shown in FIG. 1, the switch 14 may be set to connect the antenna 16 to a transmit path (Tx) of the RFFE 10. Alternatively, the switch 14 may be set to connect the antenna to a receive path (Rx) of the RFFE 10. The receive path may include a low noise amplifier 28 for amplifying the received radio frequency signals.

The features in the transmit path of the RFFE 10 will now be described.

The RFFE 10 includes a power amplifier 4. The power amplifier 4 may include a transistor, such as a bipolar junction transistor for field effect transistor for amplifying an input signal to be transmitted by the antenna 16. The power amplifier 4 may be powered by supply voltage $V_{cc}$. Inductance 6 provides an RF choke, which isolates the DC from the RF signal, and resonates with the output capacitance of the transistor in the power amplifier 4, so as to provide a resistive load at the collector of the transistor. The transmit path also includes a coupler 12 for coupling the amplified signal to the antenna 16. The coupler 12 may comprise an inductor. The transmit path may further include a capacitance 26, an input impedance matching network 2 and an output impedance matching network 8.

The operation of the power amplifier may, in accordance with embodiments of this disclosure, be controlled using a reference current $I_{ref}$. $I_{ref}$ may be used to bias the transistor of the power amplifier 4, so as to maintaining the transistor in a linear operating region. In particular, the reference current $I_{ref}$ may be used to correct for static and dynamic temperature effects in the power amplifier 4.

The RFFE 10 includes circuitry for producing the reference current $I_{ref}$. This circuitry may include a number of current mirrors 18, which can receive and process a number of input currents to generate $I_{ref}$. An output of the current mirrors may be coupled to the power amplifier 4, so as to provide the reference current $I_{ref}$ to the power amplifier 4.

The input currents, which are used by the current mirrors 18 to produce the reference current $I_{ref}$, include a first correction current $I_{ptat}$, which is proportional to an absolute, static temperature of a semiconductor die including the transistor. Accordingly, the first correction current $I_{ptat}$ may allow the static temperature of the transistor to be factored in to the generation of the reference current $I_{ref}$. The first correction current $I_{ptat}$ may be generated by a first current source 20.

During operation of the transistor of the power amplifier 4, a part of the semiconductor die in the vicinity of the transistor may change in temperature. Typically, the operation of the transistor will heat up this part of the semiconductor die, and conversely this part of the semiconductor die may cool down again when the transistor operates less or ceases to operate. To account for these changes in temperature, the input currents also include a second correction current $I_{ptdt}$. The second correction current $I_{ptdt}$ is proportional to a change in temperature of the part of the semiconductor die in which the transistor is located. Accordingly, the second correction current $I_{ptdt}$ may allow changes in temperature of the part of the semiconductor die near the transistor to be factored in to the generation of the reference current $I_{ref}$. The second correction current $I_{ptdt}$ may be generated by a second current source 22.

The input currents also include a gain selection current $I_0$. The gain selection current $I_0$ may be selected in accordance with an operational mode (e.g. required gain level) of the power amplifier 4. The gain selection current $I_0$ may be generated by a third current source 24. The gain selection current $I_0$ may itself be used in the generation of the first and second correction currents $I_{ptat}$, $I_{ptdt}$.

Figure 2:
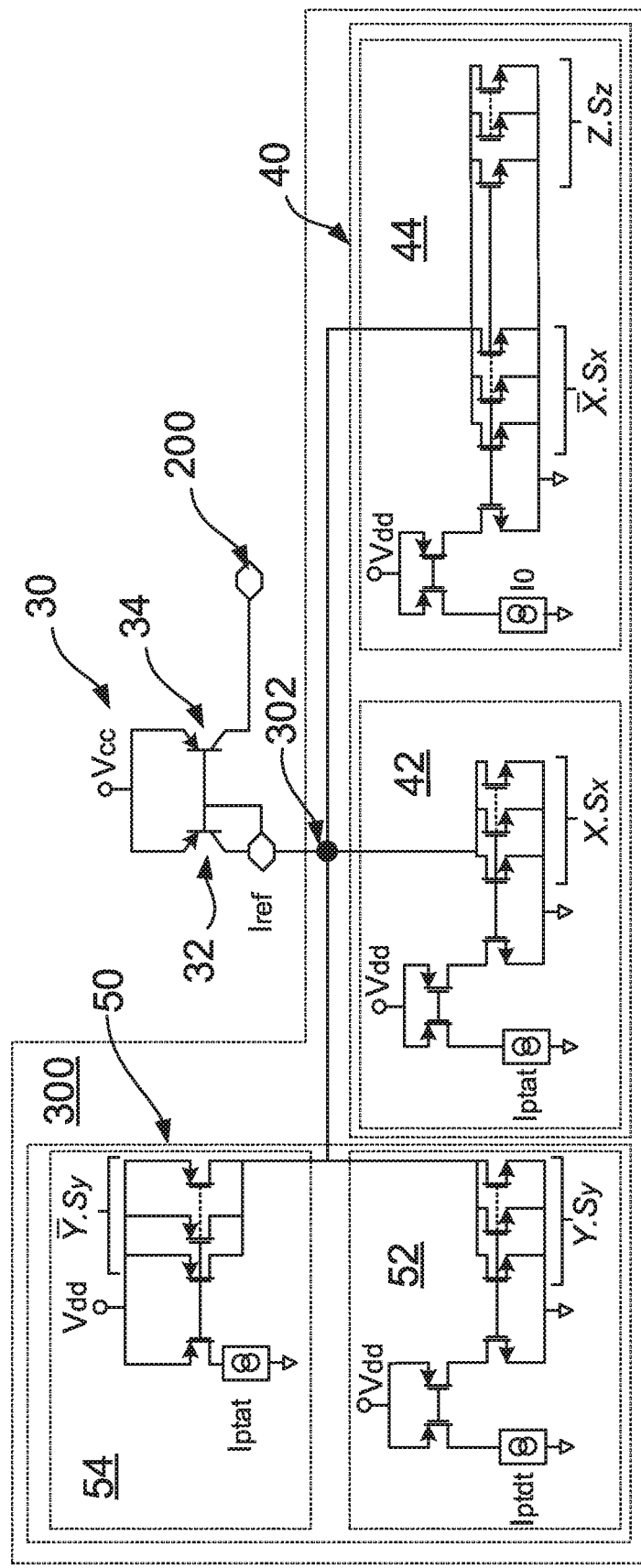
FIG. 2 shows a circuit according to an embodiment of this disclosure.

FIG. 2 shows, in more detail, circuitry 300 for producing the reference current $I_{ref}$ according to an embodiment of this disclosure. The circuit 300 includes a number of sub-circuits. In particular, the circuitry 300 includes a static temperature sub-circuit 40 and a dynamic temperature sub-circuit 50. Each sub-circuit 40, 50 and further sub-circuitry thereof, may produce a respective contribution to the reference current $I_{ref}$.

The static temperature sub-circuit 40 is configured to use the first correction current $I_{ptat}$ and the gain selection current $I_0$ to produce a contribution to the reference current $I_{ref}$ associated with the absolute, static temperature of the semiconductor die incorporating the transistor of the power amplifier 4. The static temperature sub-circuit 40 includes a first sub-circuit 42 and a second sub-circuit 44.

The dynamic temperature sub-circuit 50 is configured to use the first correction current $I_{ptat}$ and the second current $I_{ptdt}$ to produce a contribution to the reference current associated with a change in temperature of the part of the semiconductor die in which the transistor of the power amplifier 4 is located.

The dynamic temperature sub-circuit 50 in this embodiment includes circuitry 52 for producing an uncorrected contribution to the reference current associated with the change in temperature of the part of the semiconductor die in which the transistor of the power amplifier 4 is located from the second correction current $I_{ptdt}$. The dynamic temperature sub-circuit 50 in this embodiment also includes circuitry 54 for removing a static part from the contribution to $I_{ref}$ produced by the dynamic temperature sub-circuit 50. The circuitry 54 uses the first correction current $I_{ptat}$ to make this correction.

As shown in FIG. 2, the output (represented by the node 302) of the circuitry 300 is used to provide the reference current $I_{ref}$ to the power amplifier 4. Note that the node 302 is connected to the output(s) of the static temperature sub-circuit 40 and the dynamic temperature sub-circuit 50 for producing $I_{ref}$. In this embodiment, $I_{ref}$ is provided to the input of a current mirror 30 comprising a pair of transistors 32, 34. The emitters of each transistor 32, 34 are connected to the power amplifier supply voltage $V_{cc}$. The collector of the transistor 32 is coupled to the node 302 to receive $I_{ref}$. The bases of each transistor 32, 34 are coupled together, and are further coupled to the node 302 (the bases receive $I_{ref}/\beta$, where $\beta$ is the PNP current gain). The output of the current mirror 30 is provided to a replica transistor at 200. The replica transistor designates here a diode-mounted transistor, which forms with the power cell a last current mirror for a good collector current control. In this way, the collector current is an image of $I_{ref}$.

The mathematics of the generation of the reference current $I_{ref}$ will now be described.

Reference current $I_{ref}$ may be expressed as:

$$I_{ref} = A \cdot T_{die} + B + \alpha \cdot [T_{PA} - T_{die}]$$

where A, B and $\alpha$ are constants, $T_{die}$ is the absolute, static temperature of the semiconductor die in which the transistor of the power amplifier 4 is provided, and $T_{PA}$ is a temperature to which the temperature of the part of the semiconductor die in which the transistor of the power amplifier 4 is located changes during operation of the transistor (accordingly, the associated change of temperature of the power amplifier is given by $(T_{PA} - T_{die})$). Note that the junction temperature of the transistor may be considered to be substantially equal to $T_{PA}$. As will be described in more detail below, the various parts of the circuitry 300 in FIG. 2 (in particular the static temperature sub-circuit 40, the dynamic temperature sub-circuit 50 and the sub circuitry thereof) may be allocated the task of producing contributions corresponding to respective parts of the expression for $I_{ref}$ shown above.

The first reference current $I_{ptat}$ may be expressed as:

$$I_{ptat} = a \cdot T_{die} + b.$$

where a and b are constants. Note that $I_{ptat}$ is proportional to the absolute, static temperature $T_{die}$ of the power amplifier.

The second reference current $I_{ptdt}$ may be expressed as:

$$I_{ptdt} = a \cdot (T_{die} + dtT_{die}) + b.$$

where $dtT_{die} = T_{PA} - T_{die}$, and corresponds to the change in temperature of the part of the semiconductor die in which the transistor of the power amplifier 4 is located during operation of the transistor, as noted above. Note that $I_{ptdt}$ is proportional to the aforementioned change in temperature, but also includes a contribution corresponding the absolute, static temperature $T_{die}$.

The gain selection current $I_0$ may be expressed as:

$$I_0 = b.$$

Note that b appears in the expressions for $I_{ptat}$ and $I_{ptdt}$ shown above. Accordingly, the first and second correction currents $I_{ptat}$, $I_{ptdt}$ are both at least in part determined by the gain selection current $I_0$, in accordance with the operating mode of the power amplifier 4. In some embodiments, the gain selection current $I_0$ may be around 50 µA.

The circuit of FIG. 2 may use control codes to control a number of current mirrors provided within the static temperature sub-circuit 40 and the dynamic temperature sub-circuit 50 for the generation of the various contributions to the reference current $I_{ref}$. In the present embodiment, the first sub-circuit 42, second sub-circuit 44, and circuitry 52 may include current mirrors that comprise a plurality of field effect transistors (e.g. NMOS or PMOS) connected in parallel, with gates that are connected to receive a respective bit of the control code for that current mirror. In the present embodiment, the circuitry 54 may include a current mirror that comprise a plurality of field effect transistors (e.g. NMOS or PMOS) connected in parallel, with gates that are connected to receive a respective bit of the control code for that current mirror.

The control codes may be generated by digital circuitry of the circuitry 300 and provided to the current mirrors. In one example implementation, 0V or 2.5V values may be given to each control code depending on the targeted correction or gain selection. These voltages may be applied to the gate of NMOS or PMOS transistors of the current mirrors to control the current flowing within the bias circuitry.

In FIG. 2:
- $S_x$ is the ratio of the current mirrors in the static temperature sub-circuit 40 for generating $A \cdot T_{die} + B$;
- $S_y$ is the ratio of the current mirrors in the dynamic temperature sub-circuit 50 for generating $\alpha[T_{PA} - T_{die}]$;
- X is a control code to control a current mirror in the static temperature sub-circuit 40 (more particularly in the first sub-circuit 42 to be described below) for selection of a $T_{die}$ slope, corresponding to the value of the constant A (for the static error vector magnitude (EVM) temperature correction);
- $\overline{X}$ is a control code to control a current mirror in the static temperature sub-circuit 40 (more particularly in the second sub-circuit 44 to be described below) for handling the current mirror of the current $I_0$;
- Y is a control code to control a current mirror in the dynamic temperature sub-circuit 50 (more particularly in the circuitry 52 to be described below) for selection of a $dtT_{die}$ slope, corresponding to the value of the constant a (for the dynamic error vector magnitude (EVM) temperature correction);
- $\overline{Y}$ is a control code to control a current mirror in the dynamic temperature sub-circuit 50 (more particularly in the circuitry 54 to be described below) to perform a subtraction of the static part from the contribution to $I_{ref}$ produced by the dynamic temperature sub-circuit 50; and
- Z is a control code to control a current mirror in the static temperature sub-circuit 40 (more particularly in the second sub-circuit 44 to be described below) for selection the $I_{ref}$ level, corresponding to the value of the constant B.

Recalling that:

$$I_{ref} = A \cdot T_{die} + B + \alpha \cdot [T_{PA} - T_{die}]$$

the operation of the various parts of the circuit in FIG. 2 for producing the various contributions to the reference current $I_{ref}$ will now be described. In this respect, note that the reference current may also be written as: $I_{ref} = A \cdot T_{die} + \alpha \cdot dtT_{die} + B$.

In FIG. 2, the static temperature sub-circuit 40 allows the contribution $A \cdot T_{die} + B$ to $I_{ref}$ to be produced. In particular, as shown in FIG. 2, the first sub-circuit 42 includes a current mirror which uses first reference current $I_{ptat}$ to produce the contribution $A \cdot T_{die}$, and the second sub-circuit 44 includes a current mirror which uses the gain selection current $I_0$ to produce the contribution B. The outputs of the first sub-circuit 42 and second sub-circuit 44 of the static temperature sub-circuit 40 are summed at the output of the static temperature sub-circuit 40 presented at node 302.

Figure 3:
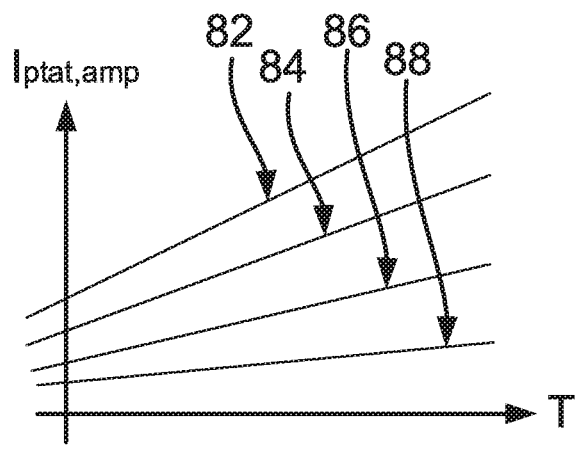
FIG. 3 shows an output of a current mirror according to an embodiment of this disclosure.

The first reference current $I_{ptat}$ may be produced from a bandgap voltage by the current source for $I_{ptat}$ shown in FIG. 2. The first sub-circuit 42 of the static temperature sub-circuit 40 controls and amplifies the first reference current $I_{ptat}$ using the current mirror $S_x$ shown in FIG. 2. The circuitry 300 may be operable to use the code word X to control the current mirror $S_x$ in the first cub-circuit 42. The output of the current mirror $S_x$ (corresponding to the first reference current $I_{ptat}$, amplified by the current mirror $S_x$), as a function of the static temperature $T_0$ is shown in FIG. 3. Each slope 82, 84, 86, 88 in FIG. 3 corresponds to a different value of the constant A.

The second sub-circuit 44 of the static temperature sub-circuit 40 uses the current mirror $S_x$ and the current mirror $S_z$ to control and amplify the gain selection current $I_0$. The circuitry 300 may be operable to use the code word $\overline{X}$ to control the current mirror $S_x$ in the second cub-circuit 44 and the code word Z to control the current mirror $S_z$ to produce the contribution B from the gain selection current $I_0$. Note that the control code Z in this embodiment is exclusively dedicated to the gain selection current (for a multi-mode power amplifier 4 operable at different gain levels).

Figure 4:
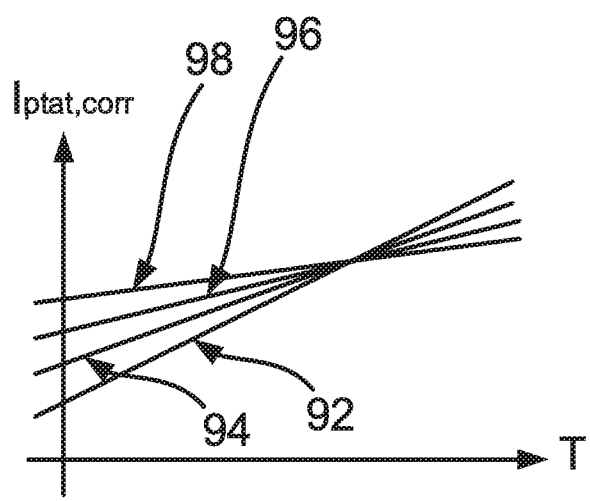
FIG. 4 shows an output of a current mirror according to an embodiment of this disclosure.

The second sub-circuit 44 acts to bring each slope 82, 84, 86, 88 shown in FIG. 3 back to the same level, thereby correcting $A \cdot T_{die}$, as produced by the first sub-circuit 42, for B, as produced by the second sub-circuit 44. The corrected slopes 92, 94, 96, 98, corresponding to $A \cdot T_{die} + B$, are shown in FIG. 4. As described herein, the output of the static temperature sub-circuit 40 is a current that is proportional to the static temperature of the die ($T_{die}$), and allows errors (the error vector magnitude (EVM)) associated with slow thermal constant and the static temperature of the die incorporating the transistor of the power amplifier 4 to be compensated for. The static temperature sub-circuit 40 may accordingly compensate for changes in ambient temperature of the die, as opposed to the typically faster changes in temperature caused by the operation of the transistor of the power amplifier 4 in the vicinity of the transistor.

As noted previously, the dynamic temperature sub-circuit 50 in this embodiment includes circuitry 52 for producing an uncorrected contribution to the reference current associated with the change in temperature of the part of the semiconductor die in which the transistor of the power amplifier 4 is located during operation of the transistor from the second correction current $I_{ptdt}$, and circuitry 54 for removing a static part from the contribution to $I_{ref}$ produced by the dynamic temperature sub-circuit 50. In particular, the circuitry 52 includes current mirror $S_y$, which controls and amplifies the second reference current $I_{ptdt}$ to produce a contribution to $I_{ref}$ corresponding to $\alpha T_{PA}$. The circuitry 300 may be operable to use the code word Y to control the current mirror $S_y$ in the circuitry 52 for producing $\alpha T_{PA}$ from the second reference current $I_{ptdt}$.

The circuitry 54 includes a (e.g. PMOS) current mirror $S_y$, which controls and amplifies the first reference current $I_{ptat}$ to produce a contribution to $I_{ref}$ corresponding to $-\alpha T_{die}$. This allows the dependency of the expression $$I_{ptdt} = a \cdot (T_{die} + dt T_{die}) + b$$

on $T_{die}$ to be removed. The circuitry 300 may be operable to use the code word $\overline{Y}$ to control the current mirror $S_y$ in the circuitry 54 for producing $-\alpha T_{die}$ from the first reference current $I_{ptat}$.

The outputs of the circuitry 52 and the circuitry 54 of the dynamic temperature sub-circuit 50 are summed at the output of the dynamic temperature sub-circuit 50 presented at node 302.

To summarise, the above stated expression for the reference current $I_{ref}$, namely $$I_{ref} = A \cdot T_{die} + \alpha \cdot dt T_{die} + B$$

may be rewritten in terms of a, b, X, Y, Z, $S_x$, $S_y$, $S_y$, Tdie and $dtT_{die}$ in line with the above described operation of the circuitry 3X) as:

$$I_{ref} = ZS_z b - XS_x b + XS_x (a \cdot T_{die} + b) + YS_y [a \cdot (T_{die} + dt T_{die}) + b] - YS_y (a \cdot T_{die} + b)$$

where:
 B=$ZS_z$b,
 A=$XS_x$a, and
 α=$YS_y$a.

Figure 5:
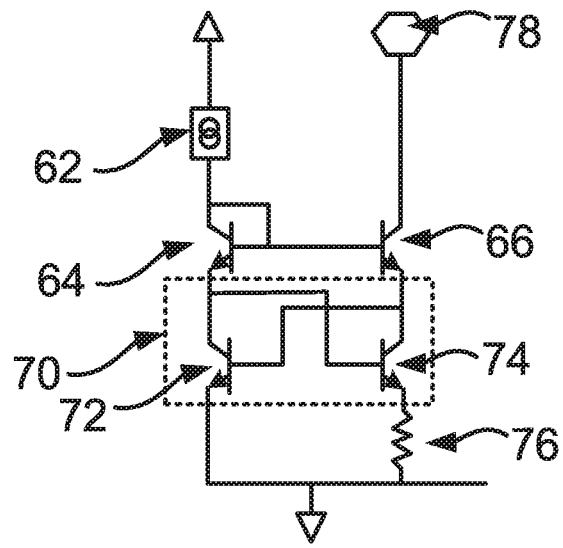
FIG. 5 shows a circuit according to an embodiment of this disclosure.
Figure 6:
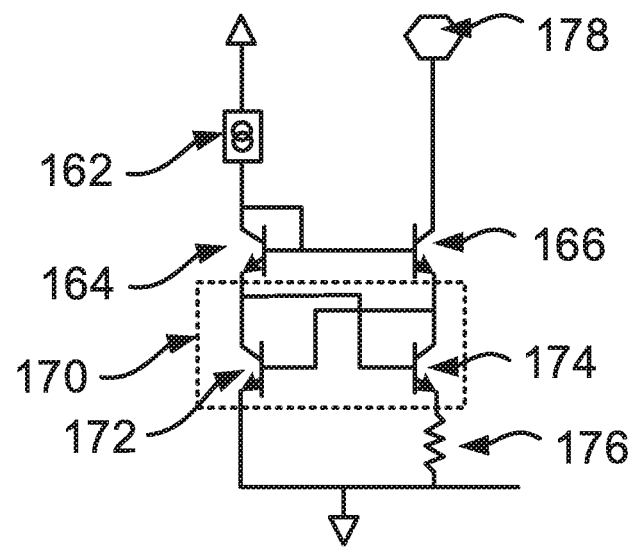
FIG. 6 shows a circuit according to an embodiment of this disclosure.

As mentioned previously, the expressions for $I_{ptat}$ and $I_{ptdt}$ shown above includes b (where b is equal to the gain selection current $I_0$), and $I_{ptat}$ and $I_{ptdt}$ are thus at least in part determined by the gain selection current $I_0$. FIG. 5 shows a circuit for producing the first reference current $I_{ptat}$ from the gain selection current $I_0$. FIG. 6 shows a circuit for producing the second reference current $I_{ptdt}$ from the gain selection current $I_0$.

The circuit of FIG. 5 includes a current mirror formed by transistors 64, 66. The circuit of FIG. 5 also includes a current source 62 which is operable to output a current based on a bandgap voltage reference. The circuit of FIG. 5 further includes a pair of cross coupled transistors 72, 74 (e.g. NPN bipolar transistors). Each transistor in the circuit of FIG. 5 includes a first current terminal, a second current terminal and a control terminal. The current terminals may for instance be the collector and the emitter of a bipolar junction transistor, and the control terminal may be the base.

The control terminal of the transistor 64 is coupled to the control terminal of the transistor 66. The current source 62 is coupled to a first current terminal (e.g. the collector) of the transistor 64 and to the control terminals of the transistors 64, 66. The second current terminal (e.g. the emitter) of the transistor 64 is coupled to the first current terminal (e.g. the collector) of the transistor 72. The second current terminal (e.g. the emitter) of the transistor 66 is coupled to the first current terminal (e.g. the collector) of the second transistor 74. The control terminal of the transistor 72 is coupled to the first current terminal (e.g. the collector) of the transistor 74. The control terminal of the transistor 74 is coupled to the first current terminal (e.g. the collector) of the transistor 72. The second current terminal (e.g. the emitter) of the transistor 72 is coupled to a reference potential, typically ground. The second current terminal (e.g. the emitter) of the transistor 74 is coupled to the reference potential (typically ground) via a resistor 76.

The circuit shown in FIG. 6 is substantially the same as the circuit shown in FIG. 5 (note that the features 162, 164, 166, 170, 172, 174, 176, 178 in FIG. 6 correspond to the features 62, 64, 66, 70, 72, 74, 76, 78 in FIG. 5, respectively). However, while the cross connected pair of transistors 72, 74 (highlighted in the box 70) in FIG. 5 is held at temperature of the die Tae (e.g. by placing the transistors 72, 74 in a separate location on the semiconductor die, which is not located in the vicinity of the die that tends to heat up during operation of the transistor), the cross connected pair of transistors 172, 174 (highlighted in the box 170) in FIG. 6 is held at temperature of the part of the semiconductor die in which the transistor of the power amplifier 4 is located $T_{P4}$, which may be the junction temperature of the transistor of the power amplifier 4. The placing of the transistors 72, 74 at $T_{die}$ allows the circuit of FIG. 5 to act as a current source for outputting (at node 78) the first reference current $I_{ptat}$. The placing of the transistors 172, 174 at $T_{P4}$ allows the circuit of FIG. 6 to track changes in temperature in the vicinity of the transistor of the power amplifier 4 during operation of the transistor, thereby to act as a current source for outputting (at node 178) the second reference current $I_{ptdt}$.

Accordingly, there has been described a temperature correction circuit and method for maintaining a transistor of a power amplifier in a linear operating region of the transistor. The temperature correction circuit includes a first current source circuit operable to provide a first correction current proportional to an absolute temperature of a semiconductor die including the transistor. The temperature correction circuit also includes a second current source circuit operable to provide a second correction current proportional to a change in temperature of a part of the semiconductor die in which the transistor is located during operation of the transistor. The temperature correction circuit further includes a third current source circuit operable to provide a gain selection current. The temperature correction circuit also includes circuitry for producing a reference current from the first and second correction currents and the gain current. The temperature correction circuit further includes an output for providing the reference current to the transistor.

Although particular embodiments of this disclosure have been described, it will be appreciated that many modifications/additions and/or substitutions may be made within the scope of the claims.

The invention claimed is:

1. A temperature correction circuit for maintaining a transistor of a power amplifier in a linear operating region of said transistor, the temperature correction circuit comprising:
 a first current source circuit operable to provide a first correction current proportional to an absolute, static temperature of a semiconductor die including said transistor;
 a second current source circuit operable to provide a second correction current proportional to a change in temperature of a part of said semiconductor die in which the transistor is located during operation of the transistor;
 a third current source circuit operable to provide a gain selection current;
 circuitry for producing a reference current from said first and second correction currents and said gain current; and
 an output for providing said reference current to said transistor.

2. The temperature correction circuit of claim 1, wherein the circuitry for producing a reference current comprises a static temperature sub-circuit configured to use said first correction current and said gain selection current to produce a contribution to the reference current associated with said absolute, static temperature of the die.

3. The temperature correction circuit of claim 1, wherein the circuitry for producing a reference current comprises a dynamic temperature sub-circuit configured to use said first correction current and said second current to produce a contribution to the reference current associated with said change in temperature of said part of the semiconductor die in which the transistor is located.

4. The temperature correction circuit of claim 3, wherein the dynamic temperature sub-circuit comprises:
   circuitry for producing said contribution to the reference current associated with said change in temperature of said part of the semiconductor die in which the transistor is located from the second correction current; and
   circuitry for removing a static part from said contribution using the first correction current.

5. The temperature correction circuit of claim 2, wherein
   the static temperature sub-circuit includes one or more programmable current mirrors for producing the contribution to the reference current associated with said absolute, static temperature of the die; and/or
   the dynamic temperature sub-circuit includes one or more programmable current mirrors for producing the contribution to the reference current associated with said change in temperature of said part of the semiconductor die in which the transistor is located.

6. The temperature correction circuit of claim 5, wherein the temperature correction circuit is configured to use one or more code words for controlling the current mirrors to produce said contributions to the reference current.

7. The temperature correction circuit of claim 1, wherein the reference current is for biasing the transistor of the power amplifier.

8. The temperature correction circuit of claim 1, configured to determine the gain selection current according to a gain mode of the power amplifier.

9. The temperature correction circuit of claim 1, wherein the first current source circuit includes a current mirror, a current source operable to output a current based on a bandgap voltage reference, and a pair of cross coupled transistors located at a temperature of said die.

10. The temperature correction circuit of claim 9, wherein the first current source circuit comprises:
    a first transistor pair comprising:
      a first transistor having a first current terminal, a second current terminal and a control terminal; and
      a second transistor having a first current terminal, a second current terminal and a control terminal; and
    a second transistor pair comprising:
      a first transistor having a first current terminal, a second current terminal and a control terminal; and
      a second transistor having a first current terminal, a second current terminal and a control terminal; and
    wherein:
      said pair of cross coupled transistors of said first current source circuit comprises said second transistor pair;
      the control terminal of the first transistor of the first transistor pair is coupled to the control terminal of the second transistor of the first transistor pair,
      the current source is coupled to the first current terminal of the first transistor of the first transistor pair and to the control terminals of the first transistor and the second transistor of the first transistor pair,
      the second current terminal of the first transistor of the first transistor pair is coupled to the first current terminal of the first transistor of the second transistor pair,
      the second current terminal of the second transistor of the first transistor pair is coupled to the first current terminal of the second transistor of the second transistor pair,
      the control terminal of the first transistor of the second transistor pair is coupled to the first current terminal of the second transistor of the second transistor pair,
      the control terminal of the second transistor of the second transistor pair is coupled to the first current terminal of the first transistor of the second transistor pair,
      the second current terminal of the first transistor of the second transistor pair is coupled to ground, and
      the second current terminal of the second transistor of the second transistor pair is coupled to ground via a resistor.

11. The temperature correction circuit of claim 1, wherein the second current source circuit includes a current mirror, a current source operable to output a current based on a bandgap voltage reference, and a pair of cross coupled transistors located at a temperature of a junction of said transistor of said power amplifier.

12. The temperature correction circuit of claim 11, wherein the first current source circuit comprises:
    a first transistor pair comprising:
      a first transistor having a first current terminal, a second current terminal and a control terminal; and
      a second transistor having a first current terminal, a second current terminal and a control terminal; and
    a second transistor pair comprising:
      a first transistor having a first current terminal, a second current terminal and a control terminal; and
      a second transistor having a first current terminal, a second current terminal and a control terminal; and
    wherein:
      said pair of cross coupled transistors of said second current source circuit comprises said second transistor pair;
      the control terminal of the first transistor of the first transistor pair is coupled to the control terminal of the second transistor of the first transistor pair,
      the current source is coupled to the first control terminal of the first transistor of the first transistor pair and to the control terminals of the first transistor and the second transistor of the first transistor pair,
      the second current terminal of the first transistor of the first transistor pair is coupled to the first current terminal of the first transistor of the second transistor pair,
      the second current terminal of the second transistor of the first transistor pair is coupled to the first current terminal of the second transistor of the second transistor pair,
      the control terminal of the first transistor of the second transistor pair is coupled to the first current terminal of the second transistor of the second transistor pair,
      the control terminal of the second transistor of the second transistor pair is coupled to the first current terminal of the first transistor of the second transistor pair,
      the second current terminal of the first transistor of the second transistor pair is coupled to ground, and
      the second current terminal of the second transistor of the second transistor pair is coupled to ground via a resistor.

13. The temperature correction circuit of claim 1, wherein the power amplifier is a Radio Frequency (RF) power amplifier.

14. The temperature correction circuit claim 1 and said power amplifier coupled to the output of the temperature correction circuit for providing the reference current to the transistor of the power amplifier.

15. A method of operating a power amplifier, the method comprising:
providing a gain selection current;
providing a first correction current proportional to an absolute temperature of a semiconductor die including a transistor of said power amplifier;
providing a second correction current proportional to a change in temperature of a part of said semiconductor die in which the transistor is located during operation of the transistor;
producing a reference current from said first and second correction currents and said gain current; and
providing said reference current to said transistor for maintaining said transistor in a linear operating region.

16. The temperature correction circuit of claim 2, wherein the circuitry for producing a reference current comprises a dynamic temperature sub-circuit configured to use said first correction current and said second current to produce a contribution to the reference current associated with said change in temperature of said part of the semiconductor die in which the transistor is located.

17. The temperature correction circuit of claim 2, wherein the reference current is for biasing the transistor of the power amplifier.

18. The temperature correction circuit of claim 3, wherein
the static temperature sub-circuit includes one or more programmable current mirrors for producing the contribution to the reference current associated with said absolute, static temperature of the die; and/or
the dynamic temperature sub-circuit includes one or more programmable current mirrors for producing the contribution to the reference current associated with said change in temperature of said part of the semiconductor die in which the transistor is located.

19. The temperature correction circuit of claim 2, configured to determine the gain selection current according to a gain mode of the power amplifier.

20. The temperature correction circuit of claim 2, wherein the first current source circuit includes a current mirror, a current source operable to output a current based on a bandgap voltage reference, and a pair of cross coupled transistors located at a temperature of said die.

* * * * *